United States Patent
Pompei et al.

(10) Patent No.: US 10,433,454 B1
(45) Date of Patent: Oct. 1, 2019

(54) PRESSURIZED UNDER-FLOOR WORK ENVIRONMENT

(71) Applicant: Amazon Technologies, Inc., Seattle, WA (US)

(72) Inventors: Giorgio Arturo Pompei, Seattle, WA (US); Frank Andrew Glynn, Leesburg, VA (US); Shawn Duane Patrick, Issaquah, WA (US)

(73) Assignee: Amazon Technologies, Inc., Seattle, WA (US)

( * ) Notice: Subject to any disclaimer, the term of this patent is extended or adjusted under 35 U.S.C. 154(b) by 936 days.

(21) Appl. No.: 14/495,216

(22) Filed: Sep. 24, 2014

(51) Int. Cl.
*H05K 7/20* (2006.01)
*E04F 15/024* (2006.01)

(52) U.S. Cl.
CPC ....... *H05K 7/20009* (2013.01); *E04F 15/024* (2013.01); *H05K 7/20709* (2013.01)

(58) Field of Classification Search
CPC ............ H05K 7/20009; H05K 7/20709; E04F 15/024
USPC .................................................. 454/184, 289
See application file for complete search history.

(56) References Cited

U.S. PATENT DOCUMENTS

| | | | | |
|---|---|---|---|---|
| 4,682,448 | A * | 7/1987 | Healey | E04G 23/00 135/117 |
| 6,604,993 | B1 * | 8/2003 | Boniface | E04F 15/02458 165/168 |
| 7,214,131 | B2 * | 5/2007 | Malone | F24F 3/044 361/695 |
| 2007/0238408 | A1 * | 10/2007 | Taylor | E04F 15/02458 454/186 |
| 2011/0028081 | A1 * | 2/2011 | Hopkins | F24F 13/15 454/259 |
| 2015/0101637 | A1 * | 4/2015 | Vatalaro | A47L 9/242 134/6 |

OTHER PUBLICATIONS

Spiceworks_Construction in the Server Room, May 19, 2014, https://community.spiceworks.com/topic/ 495499-construction-in-the-server-room-best-way-to-protect-servers-from-dust-tarp.*
Data Centre Alliance_ DCA Data Centre Anti-Contamination Guide V1.3, Oct. 4, 2013, http://c.ymcdn.com/sites/www.data-central.org/resource//collection/78F6045F-6E71-42C6-BD3E-E8779A7A259D/DCA_Data_Centre_Anti-Contamination_Guide_V1_3_final.pdf.*
Access Floor Systems_ Clear Glass Computer Floor Tile, Aug. 10, 2013, https://www.accessfloorsystems.com/index.php/clear-glass-computer-floor-tile-panel.html.*

* cited by examiner

*Primary Examiner* — Gregory L Huson
*Assistant Examiner* — Dana K Tighe
(74) *Attorney, Agent, or Firm* — Kilpatrick Townsend & Stockton LLP

(57) ABSTRACT

An isolated work space is created within a confined area used as an airflow plenum to inhibit the spread of debris and/or contamination. For example, a work area can be formed in an under-floor space of a datacenter. Forming the work area includes erecting an airflow barrier to surround a work area portion of the under-floor space, forming a lower-perimeter seal to seal a bottom edge of the airflow barrier, forming an upper-perimeter seal to seal a top edge of the airflow barrier, operatively connecting a vacuum source with the work area portion, and operating the vacuum source to reduce the air pressure within the work area portion relative to the remaining portion of the under-floor space.

17 Claims, 6 Drawing Sheets

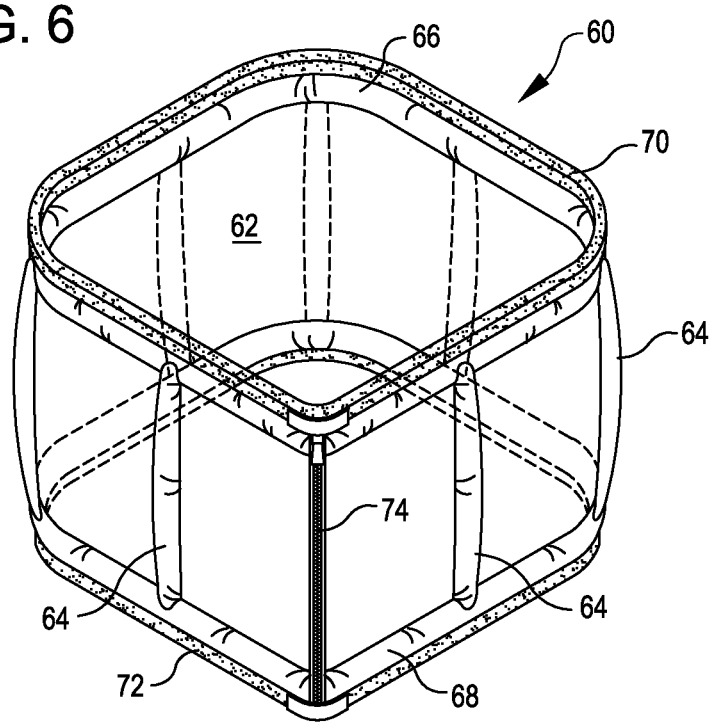
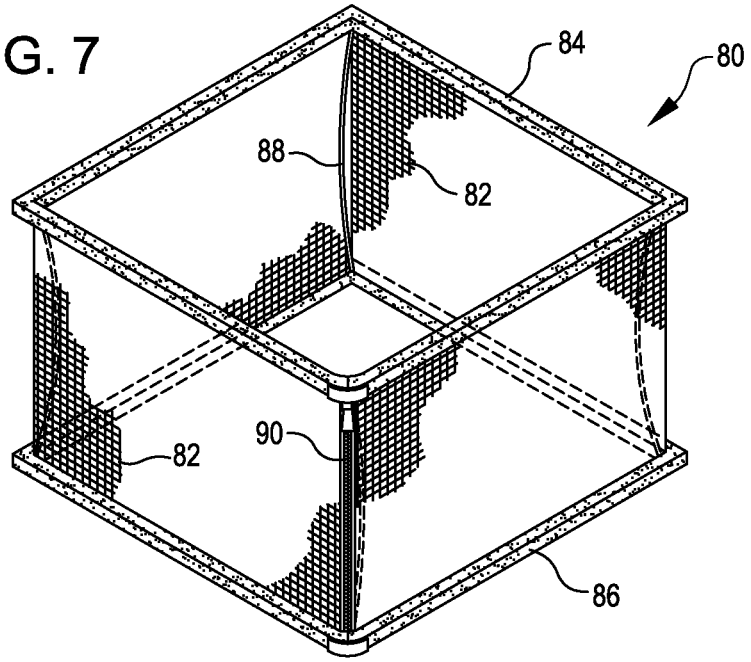

PRESSURIZED UNDER-FLOOR WORK ENVIRONMENT

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers, which enable communication between the different parts of the server farm and the users of the server farm.

Many datacenters have a raised floor to provide an under-floor space for the routing of electrical cables between datacenter components. The under-floor space can also serve as a convenient air-supply plenum used to supply cold air to cool components in the datacenter. To inhibit contamination of sensitive components of the datacenter, it is important that the under-floor space remain dust and debris free when the under-floor space is used as a cold air supply plenum. A datacenter, however, is typically operated on a continual basis. As a result, the cold air flow through the under-floor space is typically continual. There may be, however, occasions when work needs to be performed within the under-floor space without causing contamination of datacenter components via associated release of contamination within the under-floor space.

BRIEF DESCRIPTION OF THE DRAWINGS

Various embodiments in accordance with the present disclosure will be described with reference to the drawings, in which:

FIG. 6 shows a perspective view of another airflow barrier assembly for forming an isolated work area, in accordance with many embodiments.

FIG. 7 shows a perspective view of another airflow barrier assembly for forming an isolated work area, in accordance with many embodiments.

DETAILED DESCRIPTION

Figure 1:
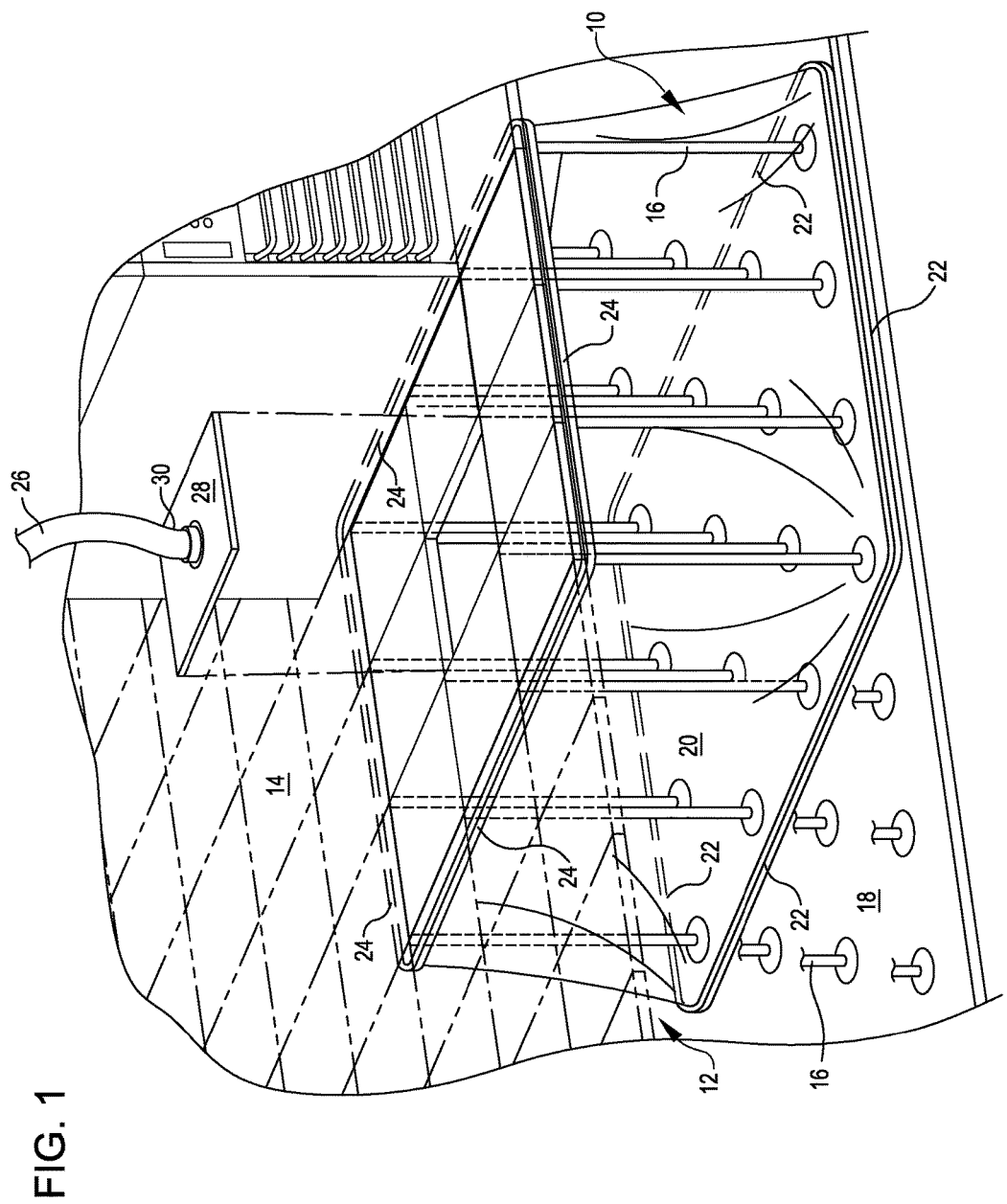
FIG. 1 shows a perspective view of a sealed volume in an under-floor space in which work can be performed while inhibiting contamination of datacenter components, in accordance with many embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to forming a work space in a larger space that forms part of an airflow distribution system. For example, the work space can be formed within an under-floor space of a datacenter that is used as a plenum to distribute cooling air to components of the datacenter. Such an under-floor space is typically formed via a raised floor. A cooling airflow is directed into the under-floor space, thereby pressurizing the under-floor space. The raised floor typically will have air outlets located and configured to direct separate cooling airflows to components of the datacenter. A suspended ceiling can be used to form a return-air plenum and have return air inlets distributed over the components of the datacenter to collect the cooling airflows supplied to the components. Because a datacenter will typically be continuously operated, the under-floor space will typically be continuously pressurized via the flow of cooling air. Such an under-floor space is also typically used to route electrical cables between components of the datacenter. At times, it may be necessary to perform work within the under-floor space, for example, to reroute existing electrical cables, to route additional electrical cables, and/or to modify the raised floor to change airflow characteristics of the cooling airflow. Performing work within the under-floor space, however, may generate contamination (e.g., fibers, particles, etc.) as a result of fabrication processes such as cutting, drilling, etc. By forming a sealed workspace within the under-floor space, any contamination generated within the sealed workspace can be contained so as to prevent the contamination from being distributed by the cooling airflows to components of the datacenter.

Thus, in one aspect, a method is provided for forming a work area in an under-floor space of a datacenter. The under-floor space is disposed between a floor surface and a raised floor. The under-floor space is used as a plenum to supply cooling air to datacenter components located above the raised floor. The work area is formed so as to inhibit airflow from the work area to components of the datacenter. The method includes erecting an airflow barrier to surround a work area portion of the under-floor space to isolate the work area portion from a remaining portion of the under-floor space. The airflow barrier extends from adjacent to the floor surface to adjacent to the raised floor so as to inhibit airflow from the work area portion into the remaining portion of the under-floor space. A lower-perimeter seal is formed between a bottom edge of the airflow barrier and the floor surface. The lower-perimeter seal extends around a lower perimeter of the airflow barrier. An upper-perimeter seal is formed between a top edge of the airflow barrier and the raised floor. The upper-perimeter seal extends around an upper perimeter of the airflow barrier. A vacuum source is operatively connected with the work area portion. The vacuum source is operated to reduce the air pressure within the work area portion relative to the remaining portion of the under-floor space, thereby further inhibiting flow of contamination from the work area portion to the datacenter components being cooled by airflow passing through the remaining portion of the under-floor space.

Any suitable approach can be used to operatively connect the vacuum source to the work area portion of the under-floor space. For example, the vacuum source can be connected with the work area portion of the under-floor space by replacing a segment of the raised floor with a prefabricated raised-floor segment having a vacuum source connector configured to operatively couple the vacuum source with the work area portion.

The airflow barrier can have any suitable construction and be erected using any suitable approach. For example, the airflow barrier can be erected by attaching the airflow barrier to one or more raised-floor support stanchions that extend between the floor surface and the raised floor. A flexible membrane can be used to form the airflow barrier. Any suitable material can be used to form the flexible membrane, for example, vinyl, plastic, plastic coated fabric, tarp, etc. The flexible membrane can be airtight and/or waterproof. In many embodiments, the flexible membrane is made from a see-through material. The airflow barrier can also be formed using prefabricated rigid panels, which can be erected and joined within the under-floor space.

In another aspect, a method is provided for forming an isolated work area within an under-floor space of a datacenter. The method includes erecting an airflow barrier to surround a work area portion of the under-floor space so as to inhibit airflow from the work area portion into a remaining portion of the under-floor space.

The method for forming the isolated work area can include additional acts to further inhibit airflow from the isolated work area portion of the under-floor space. For example, the method can include forming at least one of: (a) a lower-perimeter seal between a bottom edge of the airflow barrier and a floor surface, the lower-perimeter seal extending around a lower perimeter of the airflow barrier; and (b) an upper-perimeter seal between a top edge of the airflow barrier and a raised floor, the upper-perimeter seal extending around an upper perimeter of the airflow barrier. The method can include reducing the air pressure within the work area portion relative to the remaining portion of the under-floor space. For example, the method can include operatively connecting a vacuum source with the work area portion and operating the vacuum source to reduce the air pressure within the work area portion relative to the remaining portion of the under-floor space. The vacuum source can include a high-efficiency particulate air (HEPA) filter.

The vacuum source can be operatively connected with the work area portion using any suitable approach. For example, a segment of the raised floor can be replaced with a prefabricated raised-floor segment having a vacuum source connector configured to operatively couple the vacuum source with the work area portion. The vacuum source can then be operatively connected with the vacuum source connector. The vacuum source connector can have a tapering external shape configured to couple with any one of a plurality of different vacuum hoses having different respective inner diameters. The prefabricated raised-floor segment can be made from a see-through material to enable monitoring of personal performing work in the work area.

The airflow barrier used to form the isolated work area can be erected using any suitable approach. For example, erecting the airflow barrier can include attaching the airflow barrier to one or more raised-floor support stanchions that extend between a floor surface beneath the under-floor space and a raised floor above the under-floor space. The airflow barrier can include a flexible membrane. The airflow barrier can include prefabricated rigid panels. The airflow barrier can include a combination of any suitable number of flexible membranes and prefabricated rigid panels. The airflow barrier can include one or more prefabricated sections that can be passed through a small opening, for example, a rectangular opening approximately 2 feet by 2 feet. The one or more prefabricated sections can include one or more coupling features configured to enable joining of the one or more prefabricated sections into an erected configuration that surrounds the work area portion and inhibits airflow from the work area portion into the remaining portion of the confined space.

The approaches disclosed herein for inhibiting the spread of contamination to sensitive components conditioned by a heating, ventilation, and air conditioning (HVAC) system can be applied to any suitable confined space forming part of an airflow distribution portion of the HVAC system. For example, in another aspect, a method is provided for forming a work area within a confined space used as an airflow plenum within an HVAC system. The work area formed is configured to inhibit airflow from the work area. The method includes erecting an airflow barrier to surround a work area portion of the confined space to isolate the work area portion from a remaining portion of the confined space. The airflow barrier is configured to inhibit airflow from the work area portion into the remaining portion of the confined space. A vacuum source is operatively connected with the work area portion. The vacuum source is operated to reduce the air pressure within the work area portion relative to the remaining portion of the confined space. The vacuum source can include a high-efficiency particulate air (HEPA) filter. The method can include sealing between at least one perimeter edge of the airflow barrier and a surface at least partially defining the confined space. The airflow barrier can include a flexible membrane and/or one or more prefabricated rigid panels. The airflow barrier can include one or more prefabricated sections that include one or more coupling features configured to enable joining of the one or more prefabricated sections into an erected configuration that surrounds the work area portion and inhibits airflow from the work area portion into the remaining portion of the confined space.

In another aspect, a prefabricated modular barrier assembly is provided for forming a work area in an under-floor space of a datacenter. The under-floor space is disposed between a floor surface and a raised floor and used as a plenum to supply cooling air to datacenter components located above the raised floor. The work area is configured to inhibit airflow from the work area to components of the datacenter. The barrier includes one or more prefabricated sections that are configured be passed through a rectangular opening approximately 2 feet by 2 feet. Each of the one or more prefabricated sections includes one or more coupling features, a deformable lower edge seal member, and a deformable upper edge seal member. The one or more coupling features are configured to enable joining of the one or more prefabricated sections into an erected configuration that surrounds the work area portion and inhibits airflow from the work area portion into the remaining portion of the confined space. The deformable lower edge seal member is configured to interface with the floor surface to inhibit airflow past one or more datacenter elements crossing the lower edge seal member. The deformable upper edge seal member is configured to interface with the raised floor to inhibit airflow past one or more datacenter elements crossing the upper edge seal member.

The barrier assembly can include any suitable subcomponent. For example, the one or more prefabricated sections can include a flexible membrane. As another example, the barrier assembly can include at least one adjustable or flexible element configured to separate the lower and upper edge seal members so as to hold the lower edge seal member in contact with the floor surface and hold the upper edge seal member in contact with the raised floor.

The barrier assembly can include one or more inflatable segments. For example, the one or more prefabricated sections can include a plurality of inflatable column segments that, when inflated, separate the lower and upper edge seal members so as to hold the lower edge seal member in contact with the floor surface and hold the upper edge seal member in contact with the raised floor. The one or more prefabricated sections can include at least one inflatable upper edge segment that, when inflated, extends between upper ends of the inflatable column segments. And the one or more prefabricated sections can include at least one inflatable lower edge segment that, when inflated, extends between lower ends of the inflatable column segments.

Turning now to the drawings, in which like reference numerals represent like parts throughout the several views, FIG. 1 shows an isolated work space 10 that has been formed within a under-floor space 12 of a datacenter, in accordance with many embodiments. The workspace 10 is formed to inhibit airflow from within the workspace 10 to the rest of the under-floor space 12, thereby serving to inhibit potential spread of work-related contamination from the workspace 12 to contamination sensitive components of the datacenter via cooling airflow flowing through the under-floor space 12. The under-floor space 12 is disposed under a raised floor 14 of the datacenter. The raised floor 14 is supported by an array of support stanchions 16, which support the raised floor 14 from a base floor 18. In the illustrated embodiment, the work space 12 is formed via a flexible membrane 20 that has been erected so as to extend between the base floor 18 and the raised floor 14 and surround a selected group of the support stanchions 16 so that the work space 10 is formed in a desired portion of the overall under-floor space 12. While the illustrated embodiment shows the flexible membrane 20 surrounding four of the support stanchions 16, the flexible membrane 20 can be erected to surround any desired number of the support stanchions 16. Any suitable flexible membrane can be used. For example, suitable flexible membranes include vinyl, plastic, plastic coated fabric, tarp, etc. The flexible membrane can be airtight and/or waterproof. In many embodiments, the flexible membrane is made from a see-through material.

To further enhance inhibition of airflow from within the workspace 12, a lower perimeter seal 22 and/or an upper perimeter seal 24 can be formed to inhibit airflow from within the workspace 10 via a gap between the flexible membrane 20 and the base floor 18 and/or the raised floor 14. Any suitable approach can be used to form the lower perimeter seal 22 and/or the upper perimeter seal 24. For example, suitable approaches may include the use of a sealing foam, adhesive tape, one or more weighted members to maintain contact between a lower perimeter edge of the flexible membrane 20 and the base floor 18, one or more magnetic members to maintain contact between an upper perimeter edge of the flexible membrane 20 and a metallic support member of raised floor 14.

To further enhance inhibition of airflow from within the workspace 10, a vacuum line 26 can be used to draw air from within the workspace 10 so as to reduce the pressure within the workspace 10 relative to the rest of the under-floor space 12. In the illustrated embodiment, a floor panel of the raised floor 14 is replaced with a prefabricated floor panel 28 having a vacuum attachment 30 for the vacuum line 26. The vacuum line 26 can be operatively attached to a suitable vacuum source. In many embodiments, the vacuum source includes a high-efficiency particulate air (HEPA) filter so as to remove any work related contamination from the airflow drawn through the vacuum line 26 so as to inhibit spreading of such contamination to contamination sensitive components of the datacenter. And although not illustrated, a vacuum line extension can be used to extend the vacuum line 26 into the workspace 10 to enable removal of work related debris and/or contamination that can be removed via the vacuum line from within the workspace 10 prior to removal of the flexible membrane 20 following completion of work accomplished within the workspace 10.

Figure 2:
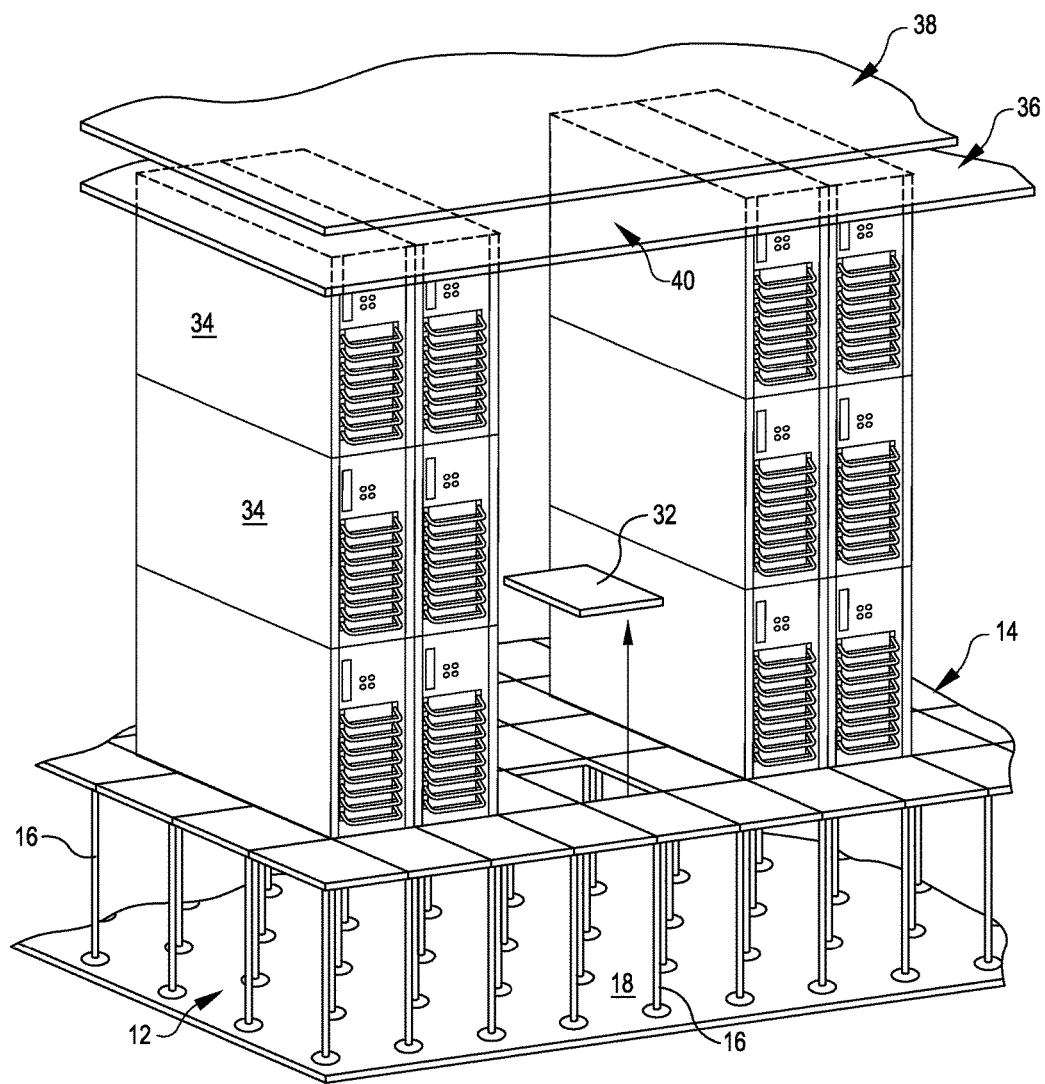
FIG. 2 shows a perspective view of a datacenter having an accessible under-floor space, in accordance with many embodiments.

FIG. 2 shows a partial view of a datacenter room having an accessible under-floor space. The under-floor space 12 is disposed under the raised floor 14, which is supported relative to the base floor 18 via an array of the support stanchions 16. The raised floor 14 can include a plurality of removable floor panels 32. In the illustrated datacenter room, a plurality of server racks 34 is shown disposed above the raised floor 14 and below a suspended ceiling 36, which is suspended below an overlying ceiling 38. A ceiling space 40 is disposed between the suspended ceiling 36 and the overlying ceiling 38.

Figure 3:
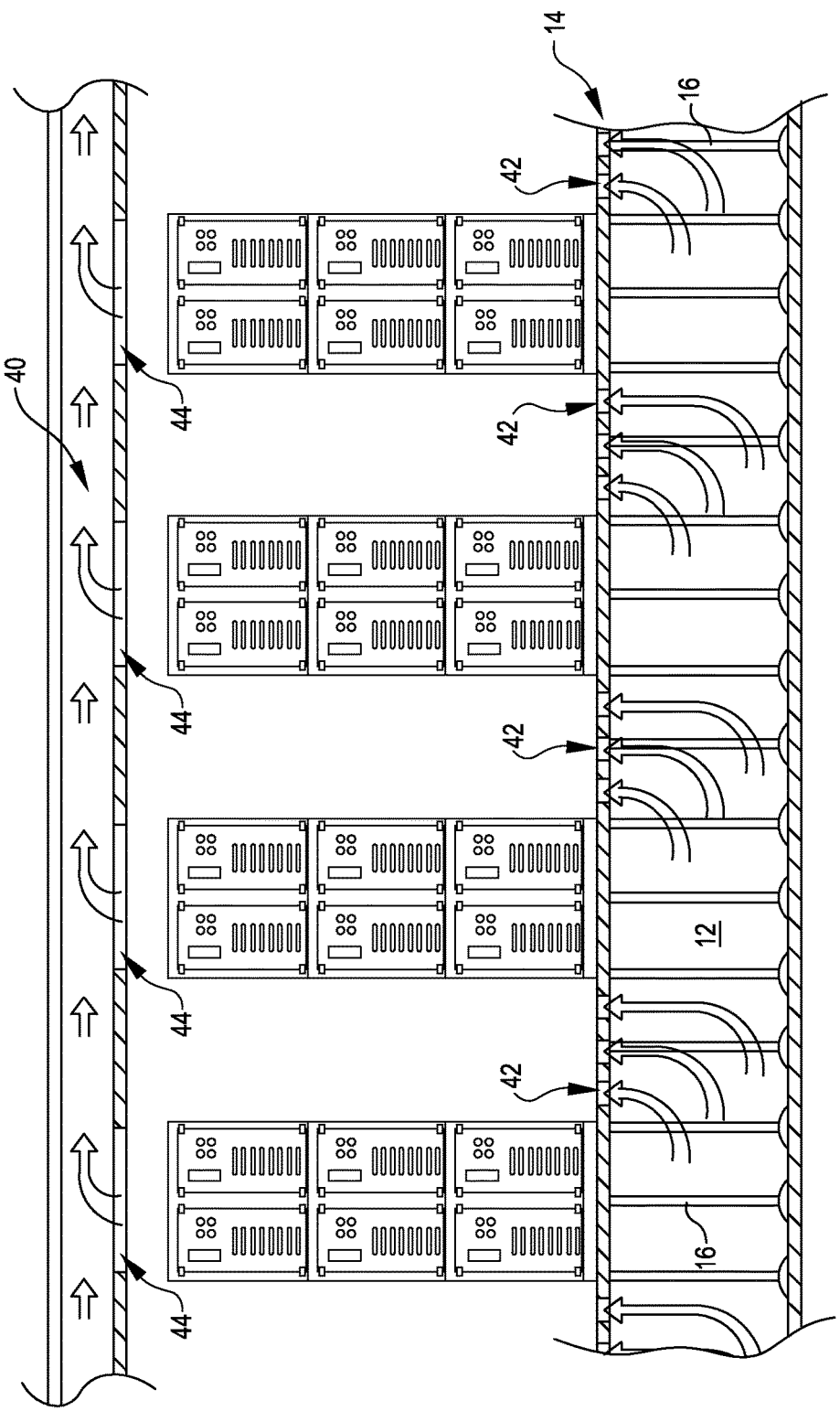
FIG. 3 is a side view of a datacenter showing the flow of cooling air through an under-floor space, in accordance with many embodiments.

FIG. 3 shows a side view of a datacenter room in which the under-floor space 12 is used as a cold-air supply plenum to distribute cooling airflows to components of the datacenter. A cooling airflow is directed into the under-floor space 12, thereby pressurizing the under-floor space 12 relative to the datacenter room above the raised floor 14. The raised floor 14 has a plurality of raised-floor airflow openings 42. Each of the raised-floor airflow openings 42 is located to direct a corresponding airflow of the cooling air to one or more components of the datacenter disposed above the respective raised-floor airflow opening 42. These components can be, for example, servers, switches, or other components that should be cooled during operation. The suspended ceiling 36 has one or more return airflow openings 44 by which cooling airflows are collected into the ceiling space 40. The ceiling space 40 serves as return air plenum from which a return airflow for the air conditioning system of the datacenter is extracted.

Because the cooling airflows emerging from the under-floor space 12 are often directed through contamination sensitive components of the datacenter, it is desirable that the emerging cooling airflows remain sufficiently contamination free. And because such cooling airflows may be substantially continuously supplied to support continual operation of the datacenter, the approaches disclosed herein for forming an isolated workspace within the under-floor space 12 can be used to enable work to be done in the under-floor space 12 in a way that inhibits spreading debris and/or contamination generated by and/or related to such work. For example, the under-floor space can be used to route electrical wires and/or fiber-optic communication lines between components of the datacenter. As such, modification and/or rerouting of such electrical wires and/or communication lines may be required from time to time. By forming a workspace enclosing a portion of the under-floor space 12 in which the work will be performed, spread of debris and/or contamination generated and/or related to the work from the enclosed workspace can be inhibited.

Figure 4:
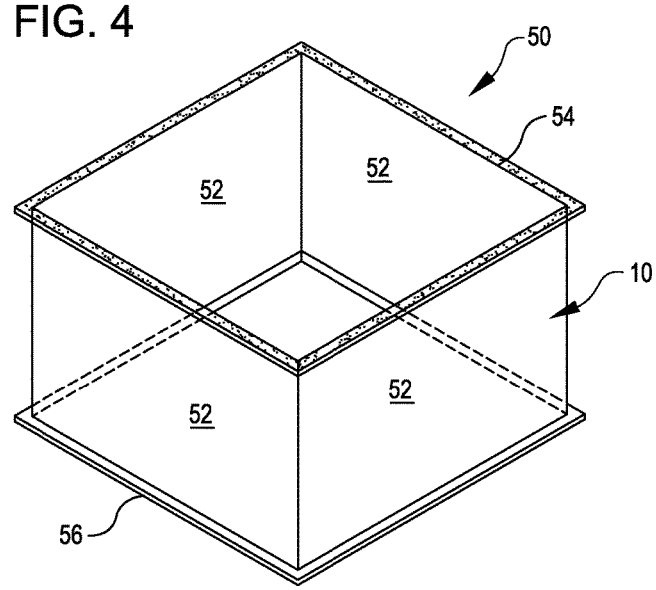
FIG. 4 shows a perspective view of an airflow barrier assembly for forming an isolated work area, in accordance with many embodiments.

FIG. 4 shows an airflow barrier assembly 50 for creating an isolated workspace 10, in accordance with many embodiments. The airflow barrier assembly 50 includes a plurality of rigid prefabricated panels 52. In many embodiments, each of the rigid panels 52 has sufficient stiffness and strength to react a pressure differential across the panel that arises when a vacuum line is coupled with the workspace 10. The prefabricated panels 52 can have a height suitable in comparison with the height of an under-floor space of a datacenter in which they would be used. For example, the prefabricated panels 52 can have a height for use in a 48 inch tall under-floor space of a data center. The prefabricated panels 52 can have any suitable length (e.g., 5 foot, 8 foot) so as to form a suitably sized work area. The airflow barrier assembly 50 can be configured to be self-supporting (i.e., without attachment to any support stanchion 16 supporting the raised floor 14). The airflow barrier assembly 50 can also be configured to be attached to any suitable number of the support stanchions 16. The airflow barrier assembly 50 can also include an upper seal 54 and a lower seal 56. The upper seal 54 can be configured to seal a gap adjacent an upper perimeter edge of the panels 52. Likewise, the lower seal 56 can be configured to seal a gap adjacent a lower perimeter edge of the panels 52.

Figure 5:
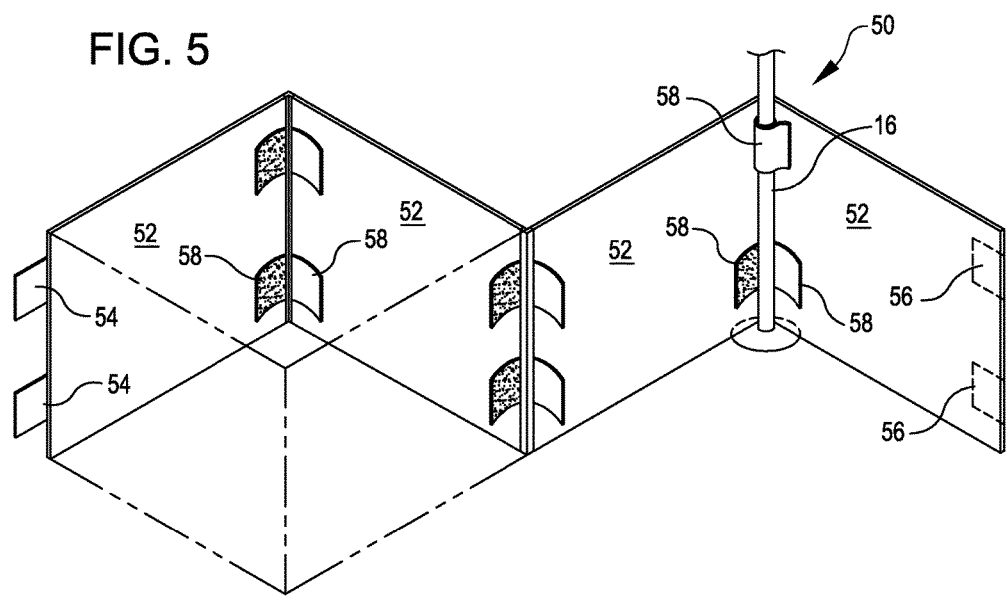
FIG. 5 shows a perspective view of the airflow barrier assembly of FIG. 4 in a partially erected configuration.
Figure 8:
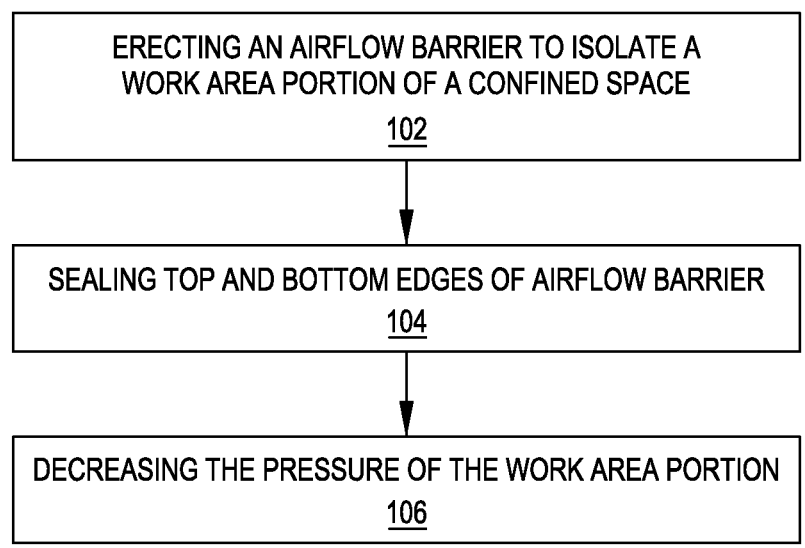
FIG. 8 is a simplified schematic diagram of acts of a method for forming a sealed volume in a confined space, in accordance with many embodiments.

FIG. 5 shows the airflow barrier assembly 50 in a partially-erected configuration. The panels 52 of the airflow barrier assembly 50 can be coupled together in any suitable way. For example, in the embodiment illustrated, the panels 52 are hinged connected along three adjoining panel edge locations. Any suitable connection can be used, including but not limited to, continuous hinged joints such as a piano-type joint, non-continuous discrete hinges, non-hinged connection mechanisms such as latches, adhesive tape, hook and loop connectors, and the like. The airflow barrier assembly 50 can be moved into the under-floor space 12 and then reconfigured into the erected configuration illustrated in FIG. 4. The illustrated airflow barrier assembly 50 include hook and loop connection straps 54 that engage complementary hook and loop regions 56 bonded to the adjacent panel to retain the airflow barrier assembly 50 in the erected configuration. While the illustrated embodiment of the airflow barrier assembly 50 has four panels, any suitable number of panels can be used, including, for example, three, five, or six or more panels.

The illustrated embodiment of the airflow barrier assembly 50 also includes hook and loop type attachment straps 58 that can be used to couple the airflow barrier assembly 50 with any suitable number of support stanchions 16. For example, the illustrated embodiment of the airflow barrier assembly 50 can be attached to one, two, three, or four of the support stanchions 16.

FIG. 6 shows an inflatable airflow barrier assembly 60 for creating an isolated workspace 10, in accordance with many embodiments. The inflatable assembly 60 includes an airtight membrane 62, a plurality of inflatable column segments 64, an inflatable upper edge segment 66, an inflatable lower edge segment 68, a deformable upper edge seal member 70, a deformable lower edge seal member 72, and a zipper assembly 74. In many embodiments, the inflatable assembly 60, when deflated, can be passed through a restricted opening, for example, through an approximately 2 feet by 2 feet rectangular opening in a raised floor of a data center that is exposed upon removal of a floor panel of the raised floor 14. Once placed into the under-floor space of the datacenter, the airflow barrier assembly 60 can be positioned to surround a desired workspace portion, which can surround one or more of the support stanchions 16. Free ends of the airflow barrier assembly 60 can then be joined via the zipper assembly 74 prior to or after inflation of the column segments 64 and the upper and lower segments 66, 68. The inflated column segments 64 serve to separate the inflated upper and lower segments 66, 68, thereby holding the upper and lower edge seal members 70, 72 in contact with the raised floor 14 and the floor 18, respectively. The inflated upper and lower segments 66, 68 extend along upper and lower edges of the airtight membrane 62. The combination of the inflated column segments 64 and the upper and inflated upper and lower segments 66, 68 holds the airtight membrane in the deployed configuration illustrated. Any suitable number of separately inflatable compartments can be used to form the inflatable column segments 64 and the inflatable upper and lower segments 66, 68. In many embodiments, the airtight membrane is formed from a see-through material to enable the ability to see into and out of the work area 10.

FIG. 7 shows another airflow barrier assembly 80 for creating an isolated workspace 10, in accordance with many embodiments. The airflow barrier assembly 80 includes an flexible membrane 82, a deformable upper edge seal member 84, a deformable lower edge seal member 86, flexible support members 88, and a zipper assembly 90. The flexible support members 88 are removable and, when installed, provide column support between the upper and lower edge seal members 84, 86 to hold the upper and lower edge seal members 84, 86 into contact with the raised floor 14 and the floor 18, respectively. In many embodiments, each of the upper and lower edge seal members 84, 86 is an assembly that includes a support beam and a deformable seal member supported by the support beam. The deformable seal member can be configured to interface with one or more datacenter elements crossing the seal member, for example, wire assemblies and/or raised floor support beams extending between the support stanchions 16. In many embodiments, the inflatable assembly 80, when disassembled, can be passed through a restricted opening, for example, through an approximately 2 feet by 2 feet rectangular opening in a raised floor of a data center that is exposed upon removal of a floor panel of the raised floor 14. Once placed into the under-floor space of the datacenter, the airflow barrier assembly 80 can be positioned to surround a desired workspace portion, which can surround one or more of the support stanchions 16. Free ends of the airflow barrier assembly 80 can then be joined via the zipper assembly 90 prior to or after installation of the flexible support members 88. While only one zipper assembly 90 is illustrated and used to join ends of a continuous assembly having four sides, any suitable number of zipper assemblies can be used to join a corresponding number of side segments. For example, the airflow assembly can have four separate sides and four zipper assemblies 90 to join the four sides.

While the approaches and related assemblies are described above in relation to an under-floor space of a datacenter, such approaches can be used in any suitable confined space in which inhibition of spread of debris and/or contamination is desired. For example, FIG. 6 is a simplified diagrammatic illustration of acts of a method 100 for forming an isolated work area within a confined space. Any of the suitable acts and/or assemblies described herein can be used to practice the method 100. The combined space can be any suitable confined space, such as an under-floor space of a datacenter or such as a confined space used as an airflow plenum to supply cooling and/or heating air that should remain substantially debris and/or contamination free. In act 102, an airflow barrier is erected to isolate a work area portion of the confined space. Any suitable approach for erecting the airflow barrier can be used, such as the approaches described herein. A flexible membrane and/or one or more prefabricated rigid panels can be used to form the airflow barrier. In act 104, top and bottom edges of the airflow barrier are sealed. Any suitable approach can be used for sealing the top and bottom edges, such as those described herein. In act 106, the pressure within the formed work area portion is decreased relative to the surrounding portion of the confined area. For example, as described herein with respect to an under-floor space of a datacenter, a vacuum line operatively connected to a vacuum source can be used to draw air from the work space portion, thereby reducing the pressure and further inhibiting spread of debris and/or contamination from the work space portion of the confined area.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method of forming a work area in an under-floor space of a datacenter, the under-floor space being disposed between a floor surface and a raised floor and used as a plenum to supply cooling air to datacenter components located above the raised floor, the work area being configured to inhibit a first airflow from the work area to the datacenter components, the method comprising:
    erecting an airtight airflow barrier to surround a work area portion of the under-floor space to isolate the work area portion from a remaining portion of the under-floor space, the airtight airflow barrier extending from adjacent to the floor surface to adjacent to the raised floor so as to inhibit a second airflow from the work area portion into the remaining portion of the under-floor space;
    forming a lower-perimeter seal between a bottom edge of the airtight airflow barrier and the floor surface, the lower-perimeter seal extending around a lower perimeter of the airtight airflow barrier;
    forming an upper-perimeter seal between a top edge of the airtight airflow barrier and the raised floor, the upper-perimeter seal extending around an upper perimeter of the airtight airflow barrier;
    inflating a plurality of inflatable column segments of the airtight airflow barrier to separate the lower-perimeter seal and the upper-perimeter seal so as to hold the lower-perimeter seal in contact with the floor surface and hold the upper-perimeter seal in contact with the raised floor;
    operatively connecting a vacuum source with the work area portion; and
    operating the vacuum source to reduce air pressure within the work area portion relative to the remaining portion of the under-floor space.

2. The method of claim 1, wherein connecting the vacuum source with the work area portion comprises replacing a segment of the raised floor with a prefabricated raised-floor segment having a vacuum source connector configured to operatively couple the vacuum source with the work area portion.

3. The method of claim 1, wherein erecting the airtight airflow barrier comprises attaching the airtight airflow barrier to one or more raised-floor support stanchions that extend between the floor surface and the raised floor.

4. The method of claim 1, wherein:
    forming the lower-perimeter seal comprises engaging a first deformable portion of the airtight airflow barrier with the floor surface; and
    forming the upper-perimeter seal comprises engaging a second deformable portion of the airtight airflow barrier with the raised floor.

5. A method of forming an isolated work area within an under-floor space of a datacenter, the method comprising:
    erecting an airtight airflow barrier to surround a work area portion of the under-floor space so as to inhibit airflow from the work area portion into a remaining portion of the under-floor space; and
    inflating a plurality of inflatable column segments of the airtight airflow barrier to separate a lower-perimeter seal of the airtight airflow barrier and an upper-perimeter seal of the airtight airflow barrier so as to hold the lower-perimeter seal in contact with the floor surface and hold the upper-perimeter seal in contact with the raised floor.

6. The method of claim 5, comprising:
   operatively connecting a vacuum source with the work area portion; and
   operating the vacuum source to reduce the air pressure within the work area portion relative to the remaining portion of the under-floor space.

7. The method of claim 6, wherein the vacuum source comprises a high-efficiency particulate air (HEPA) filter.

8. The method of claim 6, wherein connecting the vacuum source with the work area portion comprises:
   replacing a segment of a raised floor overlying the under-floor space with a prefabricated raised-floor segment having a vacuum source connector configured to operatively couple the vacuum source with the work area portion; and
   operatively coupling the vacuum source with the vacuum source connector.

9. The method of claim 8, wherein the prefabricated raised-floor segment is made from a see-through material to enable monitoring of personnel performing work in the work area.

10. The method of claim 5, wherein erecting the airtight airflow barrier comprises attaching the airtight airflow barrier to one or more raised-floor support stanchions that extend between a floor surface beneath the under-floor space and a raised floor above the under-floor space.

11. The method of claim 5, wherein:
   the airtight airflow barrier comprises prefabricated airtight rigid panels, each of the prefabricated airtight rigid panels being sized to be passed through a rectangular opening approximately 2 feet by 2 feet; and
   each of the prefabricated airtight rigid panels include one or more coupling features configured to enable joining of the prefabricated airtight rigid panels into an erected configuration that surrounds the work area portion and inhibits the airflow from the work area portion into the remaining portion of the under-floor space.

12. A method of forming a work area within a confined space used as an airflow plenum, the work area being configured to inhibit airflow from the work area, the method comprising:
   erecting an airtight airflow barrier to surround a work area portion of the confined space to isolate the work area portion from a remaining portion of the confined space, the airtight airflow barrier being configured to inhibit the airflow from the work area portion into the remaining portion of the confined space;
   inflating a plurality of inflatable column segments of the airtight airflow barrier to separate a lower-perimeter seal of the airtight airflow barrier and an upper-perimeter seal of the airtight airflow barrier so as to hold the lower-perimeter seal in contact with a floor surface and hold the upper-perimeter seal in contact with a raised floor;
   operatively connecting a vacuum source with the work area portion; and
   operating the vacuum source to reduce air pressure within the work area portion relative to the remaining portion of the confined space.

13. The method of claim 12, wherein the vacuum source comprises a high-efficiency particulate air (HEPA) filter.

14. The method of claim 12, wherein:
   the airtight airflow barrier comprises prefabricated airtight rigid panels, each of the prefabricated airtight rigid panels being sized to be passed through a rectangular opening approximately 2 feet by 2 feet; and
   each of the prefabricated airtight rigid panels include one or more coupling features configured to enable joining of the prefabricated airtight rigid panels into an erected configuration that surrounds the work area portion and inhibits airflow from the work area portion into the remaining portion of the confined space.

15. A prefabricated modular barrier assembly for forming a work area in an under-floor space of a datacenter, the under-floor space being disposed between a floor surface and a raised floor and used as a plenum to supply cooling air to datacenter components located above the raised floor, the work area being configured to inhibit a first airflow from the work area to the datacenter components, the barrier assembly comprising:
   one or more prefabricated airtight sections that can be passed through a rectangular opening approximately 2 feet by 2 feet, each of the one or more prefabricated airtight sections including:
      one or more coupling features configured to enable joining of the one or more prefabricated airtight sections into an erected configuration that surrounds the work area portion and inhibits a second airflow from the work area portion into the remaining portion of the under-floor space;
      a deformable lower edge seal member configured to interface with the floor surface to inhibit the second airflow from the work area portion into the remaining portion of the under-floor space; and
      a deformable upper edge seal member configured to interface with the raised floor to inhibit the second airflow from the work area portion into the remaining portion of the under-floor space,
   wherein the one or more prefabricated airtight sections comprise a plurality of inflatable column segments that, when inflated, separate the lower and upper edge seal members so as to hold the lower edge seal member in contact with the floor surface and hold the upper edge seal member in contact with the raised floor.

16. The prefabricated modular barrier assembly of claim 15, wherein:
   at least one of the one or more prefabricated airtight sections comprise a flexible membrane; and
   the barrier assembly further comprises at least one adjustable or flexible element configured to separate the lower and upper edge seal members so as to hold the lower edge seal member in contact with the floor surface and hold the upper edge seal member in contact with the raised floor.

17. The prefabricated modular barrier assembly of claim 15, wherein the one or more prefabricated airtight sections include:
   at least one inflatable upper edge segment that, when inflated, extends between upper ends of the inflatable column segments; and
   at least one inflatable lower edge segment that, when inflated, extends between lower ends of the inflatable column segments.

\* \* \* \* \*